(12) United States Patent
Pierrat et al.

(10) Patent No.: US 6,988,259 B2
(45) Date of Patent: Jan. 17, 2006

(54) METHOD AND APPARATUS FOR MIXED-MODE OPTICAL PROXIMITY CORRECTION

(75) Inventors: Christophe Pierrat, Santa Clara, CA (US); You-Ping Zhang, Newark, CA (US); Fang-Cheng Chang, Sunnyvale, CA (US); Hoyong Park, Sunnyvale, CA (US); Yao-Ting Wang, Atherton, CA (US)

(73) Assignee: Synopsys, Inc., Mountain View, CA (US)

( * ) Notice: Subject to any disclaimer, the term of this patent is extended or adjusted under 35 U.S.C. 154(b) by 300 days.

(21) Appl. No.: 10/327,454

(22) Filed: Dec. 20, 2002

(65) Prior Publication Data

US 2003/0097647 A1 May 22, 2003

Related U.S. Application Data

(62) Division of application No. 09/514,551, filed on Feb. 28, 2000, now Pat. No. 6,584,609.

(51) Int. Cl.
*G06F 17/50* (2006.01)
*G03F 1/00* (2006.01)

(52) U.S. Cl. .............................. 716/19; 716/4; 716/21; 430/4

(58) Field of Classification Search ................ 716/1–2, 716/4, 19–21; 430/4–5, 30
See application file for complete search history.

(56) References Cited

U.S. PATENT DOCUMENTS

| 4,231,811 A | 11/1980 | Somekh et al. .............. 148/1.5 |
| 4,426,584 A | 1/1984 | Bohlen et al. ............ 250/492.2 |
| 4,456,371 A | 6/1984 | Lin .............................. 355/71 |
| 4,812,962 A | 3/1989 | Witt ............................ 364/490 |
| 4,895,780 A | 1/1990 | Nissan-Cohen et al. ........ 430/5 |
| 4,902,899 A | 2/1990 | Lin et al. .................. 250/492.1 |
| 5,051,598 A | 9/1991 | Ashton et al. ............ 250/492.2 |
| 5,182,718 A | 1/1993 | Harafuji et al. ............. 364/490 |
| 5,208,124 A | 5/1993 | Sporon-Fiedler et al. ....... 430/5 |
| 5,241,185 A | 8/1993 | Meiri et al. .............. 250/492.2 |

(Continued)

FOREIGN PATENT DOCUMENTS

GB 2324169 A 10/1998

(Continued)

OTHER PUBLICATIONS

Ackmann, P., et al., "Phase Shifting and Optical Proximity Corrections to Improve CD Control on Logic Devices in Manufacturing for Sub 0.35 um I-Line", SPIE, vol. 3051, pp. 146-153, Mar. 12-14, 1997.

(Continued)

*Primary Examiner*—Leigh M. Garbowski
(74) *Attorney, Agent, or Firm*—Bever, Hoffman & Harms, LLP; Jeanette S. Harms

(57) ABSTRACT

A semiconductor layout testing and correction system is disclosed. The system combines both rule-based optical proximity correction and model-based optical proximity correction in order to test and correct semiconductor layouts. In a first embodiment, a semiconductor layout is first processed by a rule-based optical proximity correction system and then subsequently processed by a model-based optical proximity correction system. In another embodiment, the system first processes a semiconductor layout with a rule-based optical proximity correction system and then selectively processes difficult features using a model-based optical proximity correction system. In yet another embodiment, the system selectively processes the various features of a semiconductor layout using a rule-based optical proximity correction system or a model-based optical proximity correction system.

20 Claims, 12 Drawing Sheets

U.S. PATENT DOCUMENTS

| | | | |
|---|---|---|---|
| 5,242,770 A | 9/1993 | Chen et al. | 430/5 |
| 5,256,505 A | 10/1993 | Chen et al. | 430/5 |
| 5,340,700 A | 8/1994 | Chen et al. | 430/312 |
| 5,447,810 A | 9/1995 | Chen et al. | 430/5 |
| 5,498,579 A | 3/1996 | Borodovsky et al. | 437/250 |
| 5,553,273 A | 9/1996 | Liebmann | 395/500 |
| 5,553,274 A | 9/1996 | Liebmann | 395/500 |
| 5,631,110 A | 5/1997 | Shioiri et al. | 430/5 |
| 5,636,002 A | 6/1997 | Garofalo | 355/53 |
| 5,657,235 A | 8/1997 | Liebmann et al. | 364/474.24 |
| 5,663,017 A | 9/1997 | Schinella et al. | 430/5 |
| 5,663,893 A | 9/1997 | Wampler et al. | 364/491 |
| 5,682,323 A | 10/1997 | Pasch et al. | 364/491 |
| 5,705,301 A | 1/1998 | Garza et al. | 430/5 |
| 5,707,765 A | 1/1998 | Chen | 430/5 |
| 5,723,233 A | 3/1998 | Garza et al. | 430/5 |
| 5,740,068 A | 4/1998 | Liebmann et al. | 364/489 |
| 5,766,806 A | 6/1998 | Spence | 430/5 |
| 5,815,685 A | 9/1998 | Kamon | 395/500 |
| 5,821,014 A | 10/1998 | Chen et al. | 430/5 |
| 5,825,647 A | 10/1998 | Tsudaka | 364/167.03 |
| 5,827,623 A | 10/1998 | Ishida et al. | 430/5 |
| 5,847,959 A | 12/1998 | Veneklasen et al. | 364/468.28 |
| 5,862,058 A | 1/1999 | Samuels et al. | 364/491 |
| 5,863,682 A | 1/1999 | Abe et al. | 430/30 |
| 5,879,844 A | 3/1999 | Yamamoto et al. | 430/30 |
| 5,885,734 A | 3/1999 | Pierrat et al. | 430/5 |
| 5,900,338 A | 5/1999 | Garza et al. | 430/5 |
| 5,900,340 A | 5/1999 | Reich et al. | 430/22 |
| 5,920,487 A | 7/1999 | Reich et al. | 364/491 |
| 5,958,635 A | 9/1999 | Reich et al. | 430/30 |
| 5,972,541 A | 10/1999 | Sugasawara et al. | 430/5 |
| 5,991,006 A | 11/1999 | Tsudaka | 355/53 |
| 5,994,002 A | 11/1999 | Matsuoka | 430/5 |
| 6,007,310 A | 12/1999 | Jacobsen et al. | 417/362 |
| 6,014,456 A | 1/2000 | Tsudaka | 382/144 |
| 6,077,310 A | 6/2000 | Yamamoto et al. | 716/19 |
| 6,078,738 A | 6/2000 | Garza et al. | 395/500.22 |
| 6,081,658 A | 6/2000 | Rieger et al. | 395/500.22 |
| 6,114,071 A | 9/2000 | Chen et al. | 430/5 |
| 6,154,563 A | 11/2000 | Tsudaka | 382/144 |
| 6,168,891 B1 | 1/2001 | Shibata | 430/30 |
| 6,185,727 B1 | 2/2001 | Liebmann | 716/19 |
| 6,243,855 B1 | 6/2001 | Kobayashi et al. | 716/19 |
| 6,249,597 B1 | 6/2001 | Tsudaka | 382/144 |
| 6,249,904 B1 | 6/2001 | Cobb | 716/21 |
| 6,269,472 B1 | 7/2001 | Garza et al. | 716/21 |
| 6,282,696 B1 | 8/2001 | Garza et al. | 716/19 |
| 6,289,499 B1 | 9/2001 | Rieger et al. | 716/21 |
| 6,298,473 B1 | 10/2001 | Ono et al. | 716/21 |
| 6,370,679 B1 | 4/2002 | Chang et al. | 716/19 |
| 6,467,076 B1 * | 10/2002 | Cobb | 716/19 |

FOREIGN PATENT DOCUMENTS

| | | |
|---|---|---|
| GB | 2344436 A | 6/2000 |
| JP | 3-80525 | 4/1991 |
| JP | 3-210560 | 9/1991 |
| JP | 8-236317 | 9/1996 |
| JP | 10-133356 | 5/1998 |
| JP | 11-143085 | 5/1999 |
| WO | WO 00/67074 A1 | 11/2000 |

OTHER PUBLICATIONS

Chen, J.F., et al., "Optical Proximity Correction for Intermediate-Pitch Features Using Sub-Resolution Scattering Bars", MicroUnity Systems Engineering, Inc., Sunnyvale, California, pp. 1-16.

Chen, J.F., et al., "Practical Method for Full-Chip Optical Proximity Correction", MicroUnity Systems Engineering, Inc., Sunnyvale, California (14 pages).

Lithas, "Lithas: Optical Proximity Correction Software" (2 pages).

Microunity, "OPC Technology & Product Description", MicroUnity Systems Engineering, Inc., pp. 1-5.

Precim, "Proxima System", Precim Company, Portland, Oregon (2 pages).

Precim, "Proxima Wafer Proximity Correction System", Precim Company, Portland, Oregon (2 pages).

Rieger, M., et al., "Mask Fabrication Rules for Proximity-Corrected Patterns", Precim Company, Portland, Oregon (10 pages).

Rieger, M., et al., "Using Behavior Modeling for Proximity Correction", Precim Company, Portland, Oregon (6 pages).

Cobb, et al., "Fast Sparse Aerial Image Calculation for OPC", SPIE, vol. 2621, pp. 534-544, Sep. 20-22, 1995.

Choi, Y., et al., "Optical Proximity Correction on Attenuated Phase Shifting Photo Mask for Dense Contact Array", LG Semicon Company (11 pages).

Lucas, K., et al., "Model Based OPC for 1st Generation 193nm Lithography", Motorola Inc., IDT assignee to IMEC (12 pages).

Stimiman, J., et al., "Quantifying Proximity and Related Effects in Advanced Wafer Processes", Precim Compnay, Hewlett Packard Labs (9 pages).

Sugawara, M., et al., "Practical Evaluation of Optical Proximity Effect Correction by EDM Methodology", Sony Corporation (11 pages).

Granik, Y., et al., "MEEF as a Matrix", Mentor Graphics Corporation (11 pages).

Kang, D., et al., "Effects of Mask Bias on t he Mask Error Enhancement Factor (MEEF) of Contact Holes" (11 pages).

Matsuura, S., et al., "Reduction of Mask Error Enhancement Factor (MEEF) by the Optimum Exposure Dose Self-Adjusted Mask", NEC Corporation (12 pages).

Trans Vector, "Now Better Quality Photomasks", Trans Vector Technologies, Inc., Camarillo, California (4 pages).

Saleh, B., et al., "Reduction of Errors of Microphotographic Reproductions by Optimal Corrections of Original Masks", Optical Engineering, vol. 20, No. 5, pp. 781-784, Sep./Oct. 1981.

Lin, B.J., "Methods to Print Optical Images at Low-k1 Factors", SPIE, Optical/Laser Microlithography III, vol. 1264, pp. 2-13 (1990).

Fu, C.C., et al, "Enhancement of Lithographic Patterns by Using Serif Features", IEEE, Transactions On Electron Devices, vol. 38, No. 12, pp. 2599-2603, Dec. 1991.

Garofalo, J., et al., "Mask Assisted Off-Axis Illumination Technique for Random Logic", J. Vac. Sci. Technol. B, vol. 11, No. 6, pp. 2651-2658, Nov./Dec. 1993.

Harafuji, K., et al., "A Novel Hierarchical Approach for Proximity Effect Correction in Electron Beam Lithography", IEEE, vol. 12, No. 10, pp. 1508-1514, Oct. 1993.

Rieger, M., et al., "System for Lithography Proximity Compensation", Precim Company, Portland, Oregon, Sep. 1993 (28 pages).

Garofalo, J., et al., "Automatic Proximity Correction for 0.35um I-Line Photolithography", IEEE, pp. 92-94 (1994).

Pierrat, C., et al., "A Rule-Based Approach to E-Beam and Process-Induced Proximity Effect Correction for Phase-Shifting Mask Fabrication", SPIE, vol. 2194, pp. 298-309 (1994).

Spence, C., et al., "Automated Determination of CAD Layout Failures Through Focus: Experiment and Simulation", SPIE, vol. 2197, pp. 302-313 (1994).

Stimiman, J., et al., "Fast Proximity Correction with Zone Sampling", SPIE, vol. 2197, pp. 294-301 (1994).

Stimiman, J., et al., "Optimizing Proximity Correction for Wafter Fabrication Processes", SPIE, Photomask Technology And Management, vol. 2322, pp. 239-246 (1994).

Stimiman, J., et al., "Wafter Proximity Correction and Its Impact on Mask-Making", Bacus News, vol. 10, Issue 1, pp. 1, 3-7, 10-12, Jan. 1994.

Henderson, R., et al., "Optical Proximity Effect Correction: An Emerging Technology", Microlithography World, pp. 6-12 (1994).

Barouch, E., et al., "OPTIMASK: An OPC Algorithm for Chrome and Phase-Shift Mask Design", SPIE, Vo. 2440, pp. 192-206, Feb. 1995.

Garofalo, J., et al., "Automated Layout of Mask Assist-Features for Realizing 0.5kl ASIC Lithography", SPIE, vol. 2440, pp. 302-312 (1995).

Karklin, L., "A Comprehensive Simulation Study of the Photomask Defects Printability", SPIE, vol. 2621, pp. 490-504 (1995).

Cobb, N., et al., "Fast, Low-Complexity Mask Design", SPIE, vol. 2440, pp. 313-327, Feb. 22-24, 1995.

Rieger, M., et al., "Customizing Proximity Correction for Process-Specific Objectives", SPIE, vol. 2726, pp. 651-659 (1996).

Yen, A., et al., "Characterization and Correction of Optical Proximity Effects in Deep-Ultraviolet Lithography Using Behavior Modeling", J. Vac. Sci. Technol. B, vol. 14, No. 6, pp. 4175-4178, Nov./Dec. 1996.

Yen, A., et al., "Optical Proximity Correction for 0.3um i-line Lithography", Microelectronic Engineering, vol. 30, pp. 141-144, Jan. 1996.

Chen, J.F., et al., "Full-Chip Optical Proximity Correction with Depth of Focus Enhancement", Microlithography World (5 pages) (1997).

Morimoto, H., et al., "Next Generation Mask Strategy—Technologies are Ready for Mass Production of 256MDRAM?", SPIE, vol. 3236, pp. 188-189 (1997).

Park, C., et al., "An Automatic Gate CD Control for a Full Chip Scale SRAM Device", SPIE, vol. 3236, pp. 350-357 (1997).

Dolainsky, C., et al., "Application of a Simple Resist Model to Fast Optical Proximity Correction", SPIE, vol. 3051, pp. 774-780 (1997).

Chuang, H., et al., "Practical Applications of 2-D Optical Proximity Corrections for Enhanced Performance of 0.25um Random Logic Devices", IEEE, pp. 18.7.1-18.7.4, Dec. 1997.

Cobb, N., et al., "Experimental Results on Optical Proximity Correction With Variable Threshold Resist Model", SPIE, vol. 3051, pp. 458-468, Mar. 12-14, 1997.

Asai, N., et al., "Proposal for the Coma Aberration Dependent Overlay Error Compensation Technology", Jpn. J. Appl. Phys., vol. 37, pp. 6718-6722 (1998).

Gotoh, Y., et al., "Pattern Dependent Alignment Technique for Mix-and-Match Electron-Beam Lithography with Optical Lithography", J. Vac. Sci. Technol. B, vol. 16, No. 6, pp. 3202-3205, Nov./Dec. 1998.

Wong, A., et al., "Lithographic Effects of Mask Critical Dimension Error", SPIE, vol. 3334, pp. 106-115 (1998).

Ohnuma, H., et al., "Lithography Computer Aided Design Technology for Embedded Memory in Logic", Jpn. J. Appl. Phys., vol. 37, Part I, No. 12B, pp. 6686-6688, Dec. 1998.

Cobb, N., "Fast Optical and Process Proximity Correction Algorithms for Integrated Circuit Manufacturing", Dissertation, University of California at Berkeley, UMI Microform 9902038 (139 pages).

Spence, C., et al., "Integration of Optical Proximity Correction Strategies in Strong Phase Shifters Design for Poly-Gate Layers", Bacus News, vol. 15, Issue 12, pp. 1, 4-13, Dec. 1999.

Balasinski, A., et al., "Comparison of Mask Writing Tools and Mask Simulations for 0.16um Devices", IEEE, SEMI Advanced Semiconductor Manufacturing Conference, pp. 372-377 (1999).

* cited by examiner

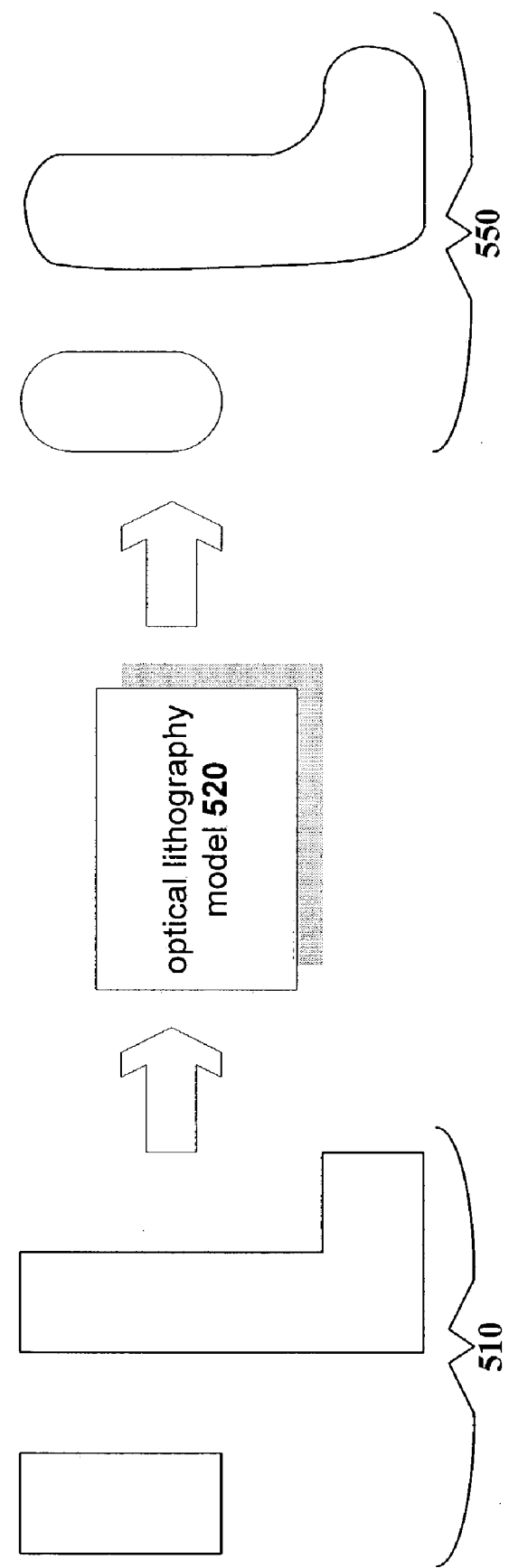

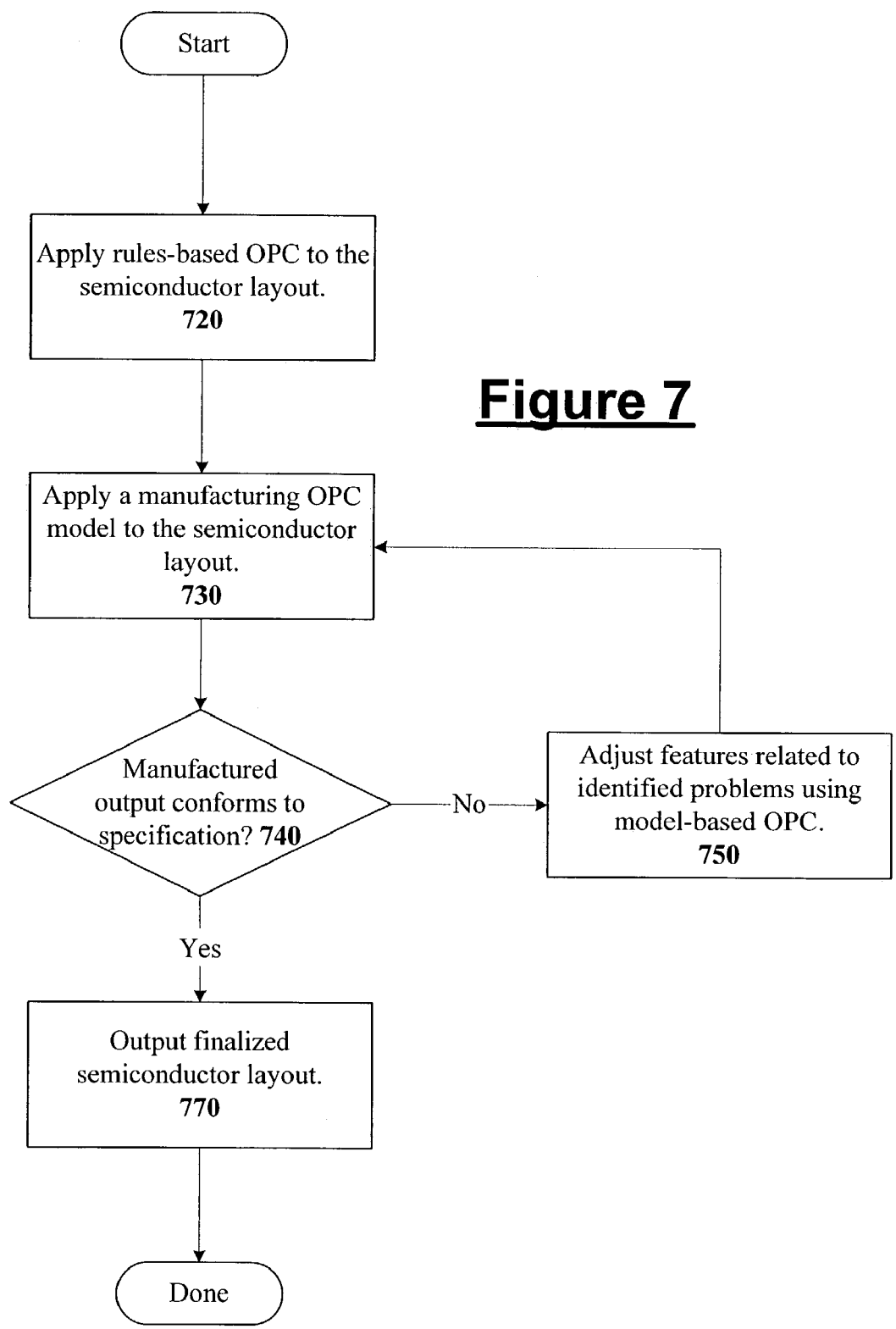

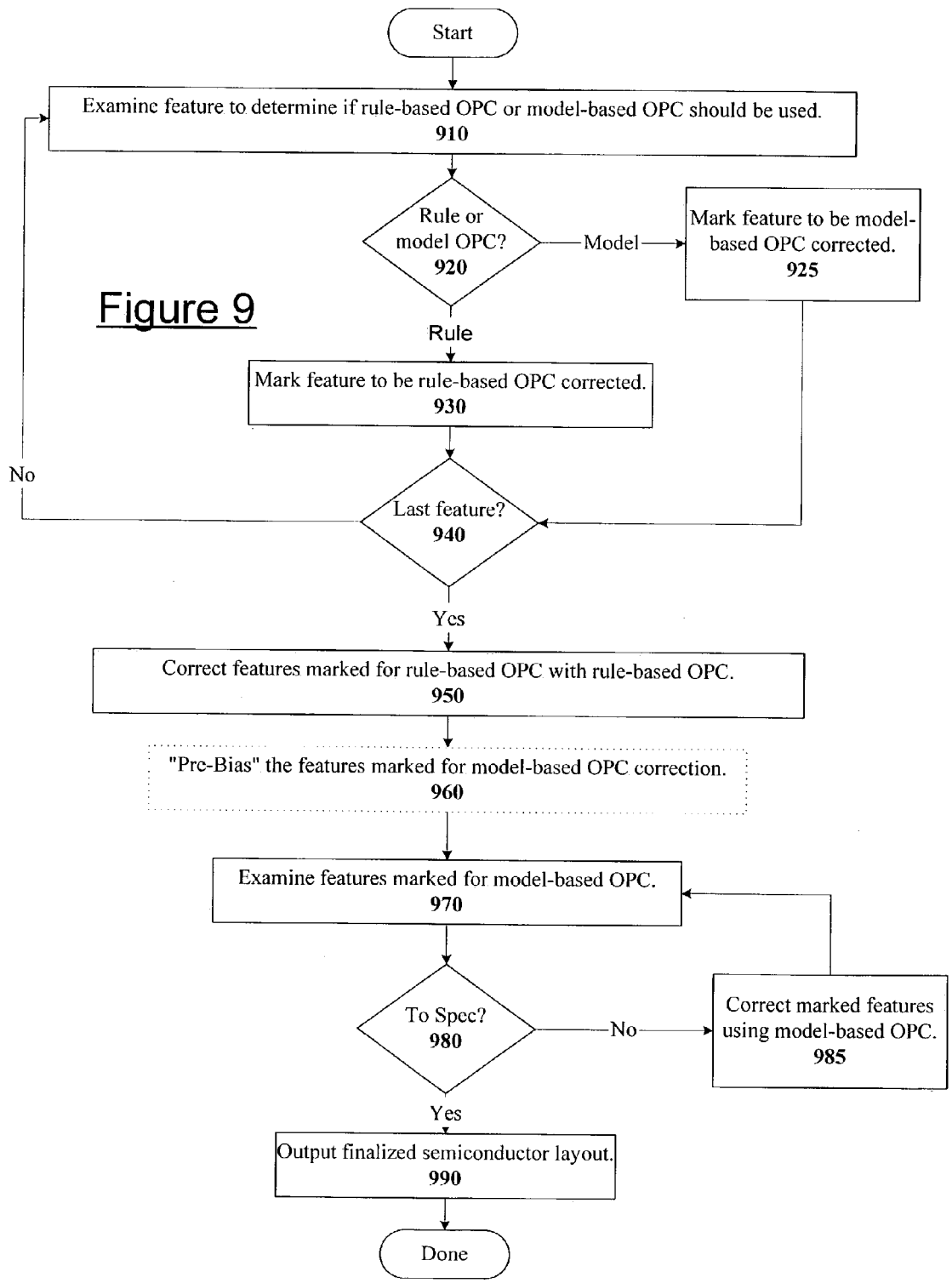

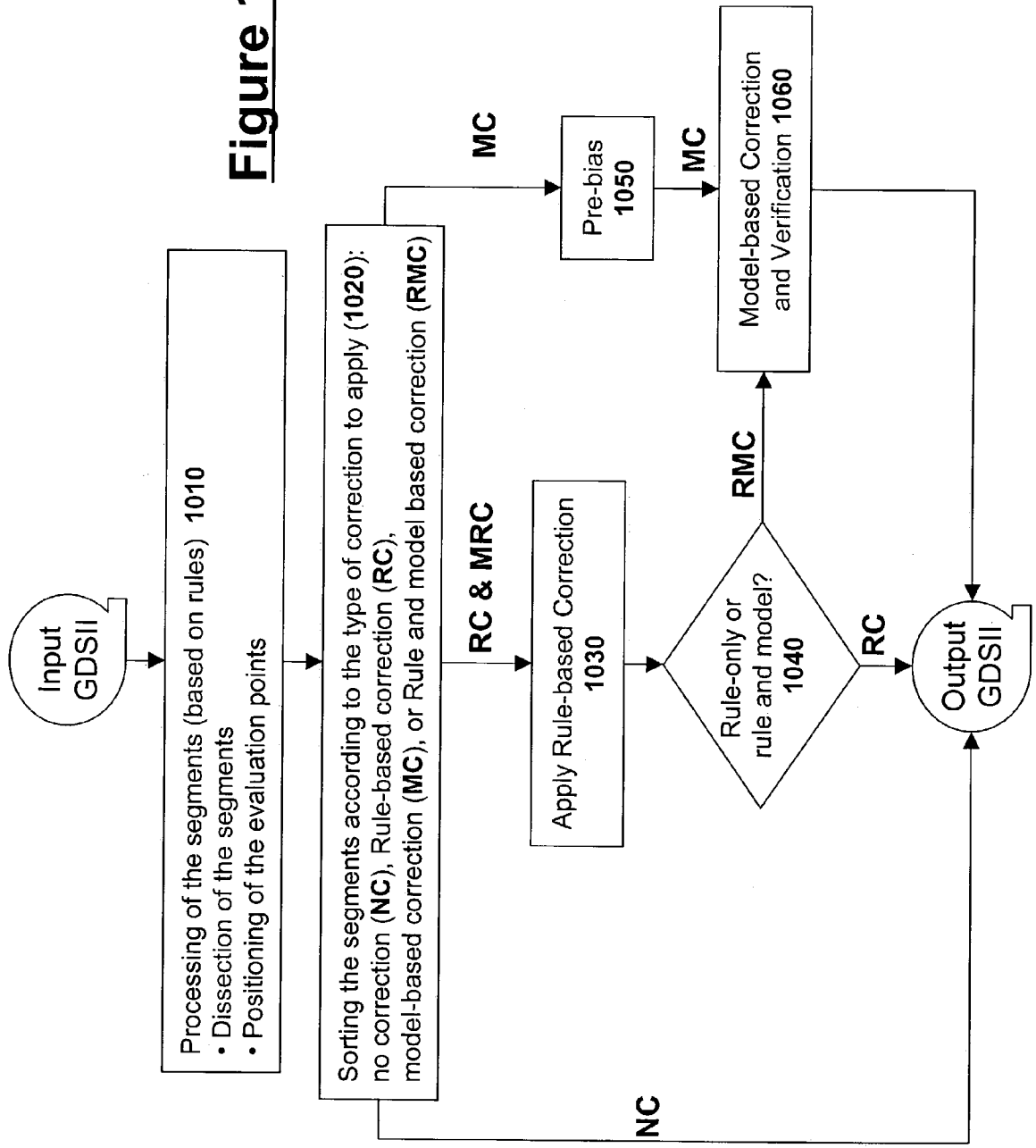

Process (program execution) flow
Edge database flow
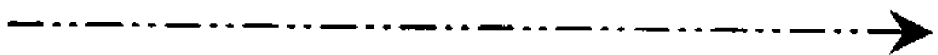
Input geometry (layout) flow
Figure 11B

METHOD AND APPARATUS FOR MIXED-MODE OPTICAL PROXIMITY CORRECTION

FIELD OF THE INVENTION

The present invention relates to the field of electronic semiconductor design and manufacture. In particular the present invention discloses methods for performing optical proximity correction. The present application is a divisional of commonly owned U.S. patent application Ser. No. 09/514,551, "METHOD AND APPARATUS FOR MIXED-MODE OPTICAL PROXIMITY CORRECTION" filed Feb. 28, 2000 now U.S. Pat. No. 6,584,609, issued Jun. 24, 2003.

BACKGROUND OF THE INVENTION

Semiconductor manufacturers produce semiconductors using optical lithography. Optical lithography is a specialized printing process that puts detailed patterns onto silicon wafers. Semiconductor manufacturers create a "mask" and then shine light through the mask to project a desired pattern onto a silicon wafer that is coated with a very thin layer of photosensitive material called "resist." The bright parts of the image pattern cause chemical reactions that make the resist material become soluble. After development, the resist forms a stenciled pattern across the wafer surface that accurately matches the desired pattern of the semiconductor circuit. Finally, this pattern is transferred onto the wafer surface via another chemical process.

To improve semiconductor performance, semiconductor researchers and engineers keep shrinking the size of the circuits on semiconductor chips. There are two main reasons to reduce the size of semiconductor circuits: (1) smaller features allow silicon chips to contain more circuit elements and thus be more complex. Similarly, a smaller circuit size allows more copies of the same die to appear on a single silicon wafer. (2) smaller circuit devices use less power and may operate at higher frequencies (faster rates) to produce higher performance semiconductor chips.

As semiconductor circuit sizes have reduced, the limits of optical lithography are being tested. However, the move to new semiconductor processes such as X-ray lithography is viewed as difficult and expensive. To extend the use of optical lithography into feature sizes that are smaller than the light wavelength used in the optical lithography process, a set of sub-wavelength techniques have been developed. Two sub-wavelength technologies that have been developed include phase-shifting and optical proximity correction. Phase shifting utilizes optical interference to improve depth-of-field and resolution in lithography. Optical proximity correction alters the original layout mask to compensate for nonlinear distortions caused by optical diffraction and resist process effects. Optical proximity correction may also correct for mask proximity effects, dry etch effects, and other undesirable effects of the optical lithography process.

Optical proximity correction is often performed by modeling the final manufactured output of a semiconductor design and then determining what changes should be made to the semiconductor layout design to obtain a desired result. The semiconductor process modeling produces very accurate results. However, the semiconductor process modeling is extremely computationally expensive. Furthermore, adjusting a semiconductor layout design using model-based optical proximity correction is a very laborious task. It would be desirable to have a method of using optical proximity correction that produces good results within a short amount of time and reduce human intervention.

SUMMARY OF THE INVENTION

A semiconductor layout testing and correction system is disclosed. The system combines both rule-based optical proximity correction and model-based optical proximity correction in order to test and correct semiconductor layouts. In a first embodiment, a semiconductor layout is first processed by a rule-based optical proximity correction system and then subsequently processed by a model-based optical proximity correction system. In another embodiment, the system first processes a semiconductor layout with a rule-based optical proximity correction system and then selectively processes difficult features using a model-based optical proximity correction system. In yet another embodiment, the system selectively processes the various features of a semiconductor layout using a rule-based optical proximity correction system or a model-based optical proximity correction system.

Other objects, features, and advantages of present invention will be apparent from the company drawings and from the following detailed description.

BRIEF DESCRIPTION OF THE DRAWINGS

The objects, features, and advantages of the present invention will be apparent to one skilled in the art, in view of the following detailed description in which:

FIG. 5 conceptually illustrates the modeling of the optical lithography process.

FIG. 7 illustrates a flow diagram of an optical proximity correction system that uses both rule-based optical proximity correction and model-based optical proximity correction.

FIG. 9 illustrates a flow diagram of an optical proximity correction system that selectively applies rule-based optical proximity correction or model-based optical proximity correction to various layout features.

FIG. 10 illustrates a conceptual diagram of an optical proximity correction system that selectively applies rule-based optical proximity correction, model-based optical proximity correction, rule-based and model-based optical proximity correction, or no correction to various layout features.

FIG. 11B illustrates a legend for the flow diagram of FIG. 11A.

DETAILED DESCRIPTION OF THE PREFERRED EMBODIMENT

A method and apparatus for mixed-mode optical proximity correction is disclosed. In the following description, for purposes of explanation, specific nomenclature is set forth to provide a thorough understanding of the present invention. However, it will be apparent to one skilled in the art that these specific details are not required in order to practice the present invention. For example, the present invention has been described with reference to optical lithography. However, the same techniques can easily be applied to other types of semiconductor processes such as X-ray lithography, Extreme UV lithography, electron beam manufacturing, and focused ion beam manufacturing.

Optical Proximity Correction

Figure 1A:
FIG. 1A illustrates an ideal mask of a geometric pattern.
Figure 1B:
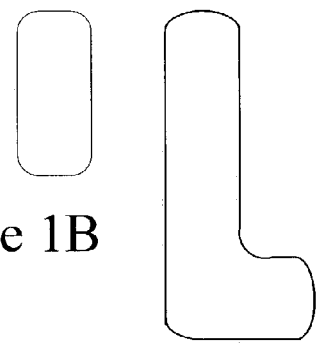
FIG. 1B illustrates a mask of the ideal geometric pattern of FIG. 1A.
Figure 1C:
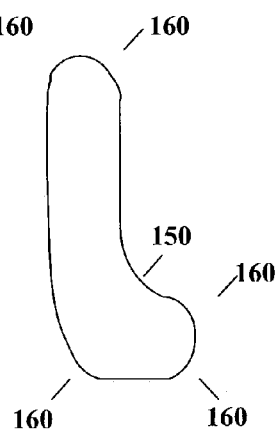
FIG. 1C illustrates a circuit element created in the photoresist of a silicon wafer using the mask of FIG. 1B.

Semiconductor manufacturers are reaching the limits of optical lithography using visible light wavelengths. FIGS. 1A through 1C illustrate an example of the difficulties of using optical lithography to create small features that are smaller than the light wavelength used in the lithography processes. FIG. 1A illustrates an ideal pair of geometric features to be etched into a silicon wafer. When a photomask is created, the photomask is not a perfect representation of the ideal geometric feature. For example, FIG. 1B illustrates a photomask of the ideal geometric features illustrated in FIG. 1A.

When the photomask of FIG. 1B is used in the optical lithography process, the final output silicon may appear as illustrated in FIG. 1C. Note that the outside corners 160 of the final output features become have become shortened and rounded. Similarly, the inside corner 150 has become rounded and occupies more space than desired. Thus, the output features of FIG. 1C only appear roughly similar to the ideal output features of FIG. 1A.

To extend the use of optical lithography to create geometric features that are smaller than the light wavelength used in the optical lithography process, a set of sub-wavelength techniques have been developed. Optical proximity correction is one of those sub-wavelength techniques. Optical proximity correction is the process of altering the original mask to compensate for nonlinear distortions caused by optical diffraction and photoresist process effects.

Figure 2A:
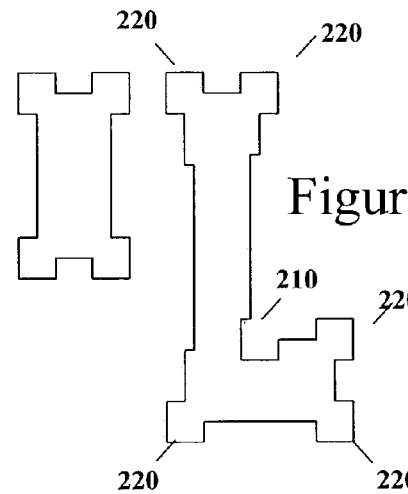
FIG. 2A illustrates an optical proximity corrected version of the ideal geometric pattern of FIG. 1A.
Figure 2B:
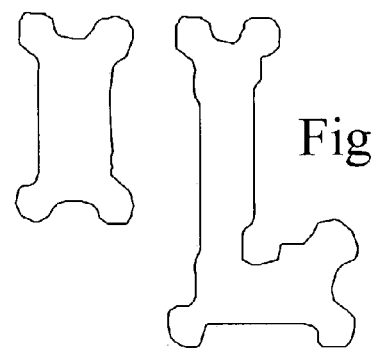
FIG. 2B illustrates an optical proximity corrected photomask of the optical proximity corrected version of the ideal geometric pattern illustrated in FIG. 2A.
Figure 2C:
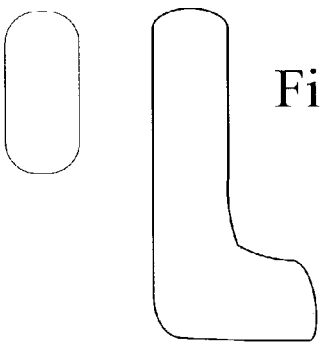
FIG. 2C illustrates a circuit element created in the photoresist of a silicon wafer using the photomask of FIG. 2B.

FIGS. 2A through 2C illustrate how optical proximity correction can be used to improve the optical lithography process to create a better version of the features illustrated in FIGS. 1A through 1C. Referring to FIG. 2A, the ideal geometric feature layout of FIG. 1A has been altered to compensate for optical diffraction and other effects. As illustrated in FIG. 2A, a serif has been added to the outside corners to provide extra area that reduce diffraction effects. Similarly, the inside corner 210 has area removed. When a photomask of the optical proximity corrected version is created, it may appear as illustrated in FIG. 2B. When the optical proximity corrected photomask of FIG. 2B is used within the optical lithography process to create a silicon semiconductor, the output circuit features may appear as illustrated in FIG. 2C. As can be seen from the drawings, the optical proximity corrected output circuit illustrated in FIG. 2C more accurately resembles the desired geometric features of FIG. 1A that the uncorrected output circuit of FIG. 1C.

There are two main methods of performing optical proximity correction: rule-based optical proximity correction and model-based optical proximity correction. Each method has its own advantages and disadvantages.

Rule-Based Optical Proximity Correction

A first method of performing optical proximity correction is to create and apply a set of optical proximity correction rules. Each optical proximity correction rule tests for a particular condition wherein optical proximity correction may be necessary. To illustrate how rule-based optical proximity correction operates, a couple of sample optical proximity correction rules are provided:

1. If an outside corner is detected then add a serif to provide extra area around the corner.
2. If a feature line from a first object is very closely parallel to another feature line of a second object then move the feature line of the wider of the two objects away from the other feature line.

These are only two example rules; many other different rules exist or may be subsequently created. Rules are often generated offline by way of simulation for very typical and general patterns. It is possible that different features are mistakenly characterized as the same such that an inaccurate correction is performed.

Figure 3A:
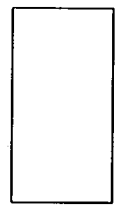
FIG. 3A illustrates an ideal rectangular geometric feature.
Figure 3B:
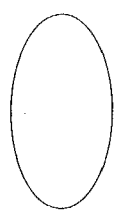
FIG. 3B illustrates a circuit element created in the photoresist of a silicon wafer using the photomask of FIG. 3A.
Figure 3C:
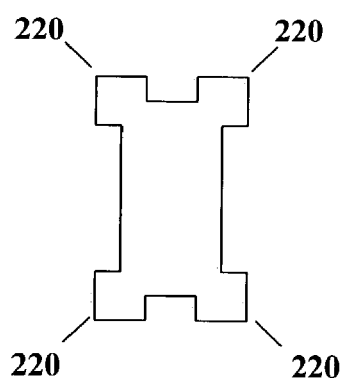
FIG. 3C illustrates the rectangular geometric feature of FIG. 3A after it has been processed by a rule-based optical proximity corrector that adds serifs to outside corners.
Figure 3D:
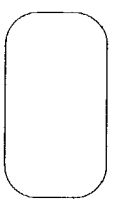
FIG. 3D illustrates a circuit element created in the photoresist of a silicon wafer using the optical proximity corrected photomask of FIG. 3C.

The first rule is illustrated with reference to FIGS. 3A, 3B, 3C, and 3D. Referring to FIG. 3A, a geometric feature has four corners. Due to light diffraction around the corners of the mask pattern in FIG. 3A, the resultant feature in the photoresist appears as illustrated in FIG. 3B. To counteract this effect, a serif has been added around the corner of the mask as illustrated in FIG. 3C. The end-result is an improved end-result geometric feature as illustrated in FIG. 3D.

Figure 4A:
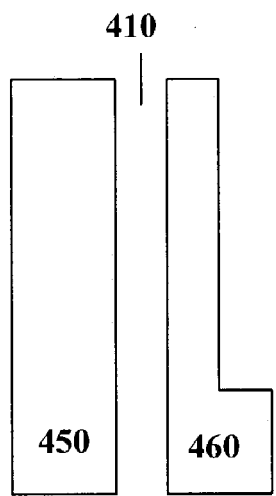
FIG. 4A illustrates two close geometric features that have closely parallel feature lines.
Figure 4B:
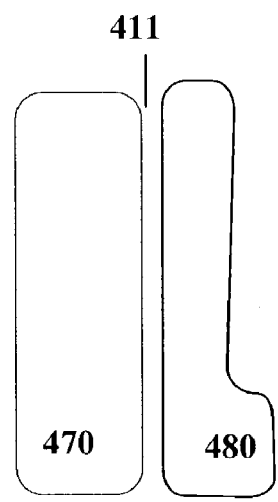
FIG. 4B illustrates a circuit element created in the photoresist of a silicon wafer using the photomask of FIG. 4A.
Figure 4C:
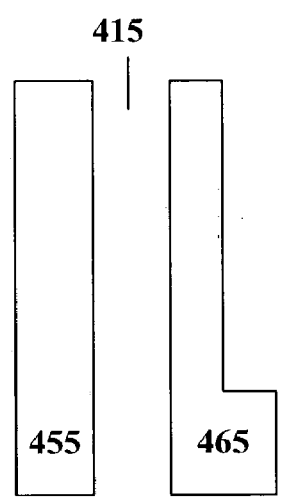
FIG. 4C illustrates the geometric features of FIG. 4A after enlarging the gap between the two features.
Figure 4D:
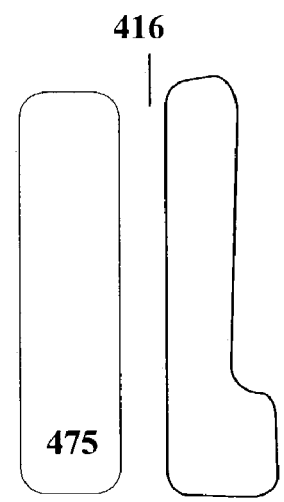
FIG. 4D illustrates a circuit element created in the photoresist of a silicon wafer using the photomask of FIG. 4C.

The second rule ensures that adjacent parallel feature lines are not too close. FIG. 4A illustrates two adjacent geometric objects 450 and 460 that have very close parallel lines separated by the space 410. When parallel features are so close, the manufactured features may appear too close as illustrated in FIG. 4B. To prevent such features from being manufactured too close to each other, the space 410 between geometric objects 450 and 460 should be increased. FIG. 4C illustrates two features after the space 415 between the geometric features 455 and 465 has been widened. The rule selects the wider of the two objects (object 450) and moves its parallel adjacent feature line away from the other object (object 460). The final manufactured result is illustrated in FIG. 4D.

Rule-based optical proximity correction has the advantage that it is relatively simple to apply once a set of optical proximity correction rules have been defined. No very complex calculations are required to improve the final layout. A rule engine simply attempts to apply each rule to each feature of a proposed layout. However, the rules-based optical proximity correction system is rigid in that only problems that have associated rules are handled. Furthermore, the number of rules can grow exponentially as smaller and smaller processes are used. This is especially true when the features size is much smaller than the range of the proximity effect. It is very difficult to maintain such large rule sets. Since each layout change affects the entire nearby region, it is difficult to create rules when the light wavelength exceeds the feature's size.

Model-Based Optical Proximity Correction

Model-based optical proximity correction operates using a mathematical model of the manufacturing process. The mathematical model of the manufacturing process accurately determines how the output circuit pattern would appear if a given photomask layout pattern was put through that particular manufacturing process. It should be noted that many different models are created for many different manufacturing processes. Each manufacturing process may have more than one different type of model. For an optical lithography processes, the model may handle effects such as mask fabrication effects, optical effects, resist processing effects, dry or wet etching effects, or other effects of the optical lithography process.

FIG. 5 conceptually illustrates the model-based optical proximity correction process. Referring to FIG. 5, circuit designers work with electronic design tools to create a layout pattern 510. An optical lithography model 520 is then applied to the input layout pattern 510 to simulate the optical lithography process. The optical lithography model 520 produces an output-modeled circuit 550. One type of optical lithography model is a convolution model. Current optical lithography convolution models are very accurate such that the output-modeled circuit produced by the optical lithography convolution model is almost exactly like the real circuit output from an actual optical lithography process.

By examining the output modeled circuit pattern from an optical lithography convolution model, trouble spots can be located. The source areas of the pattern mask that created the trouble spots can then be adjusted. Typically, reference points on the output circuit pattern are selected and specified to be located at a certain defined location within a designated threshold tolerance. Then, the related feature of the input layout pattern is adjusted until the reference point of the output circuit pattern falls within the designated threshold of the defined location.

Figure 6A:
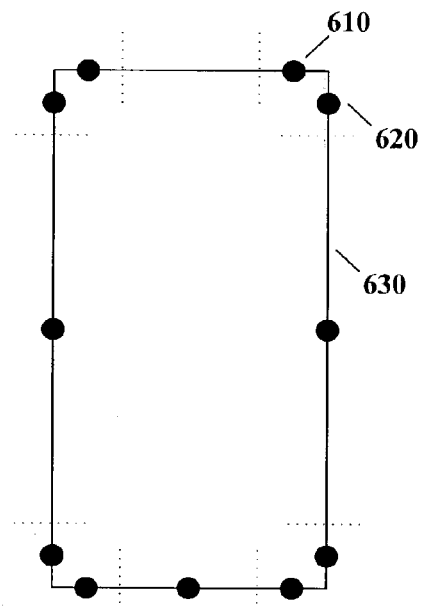
FIG. 6A illustrates the layout of an ideal rectangular geometric feature that has had its segments subdivided.
Figure 6B:
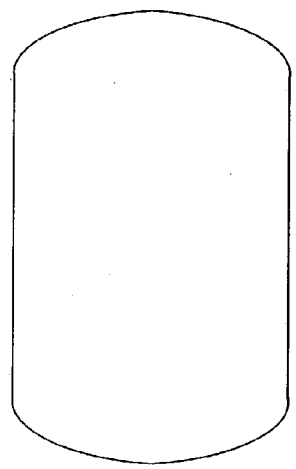
FIG. 6B illustrates a circuit element created in the photoresist of a silicon wafer using the photomask of FIG. 6A.

One method of performing model-based optical proximity correction is to divide each feature into many sub segments and adjust each individual sub segment to obtain the desired resultant feature. An example of this is provided with reference to FIGS. 6A, 6B, 6C, and 6D. FIG. 6A illustrates an example rectangular feature that normally has four segments. However, to carefully adjust how the output circuit device will appear, each of the four segments has been sub-divided into three smaller segments. FIG. 6B illustrates the normal output of the rectangular feature of FIG. 6A.

Figure 6C:
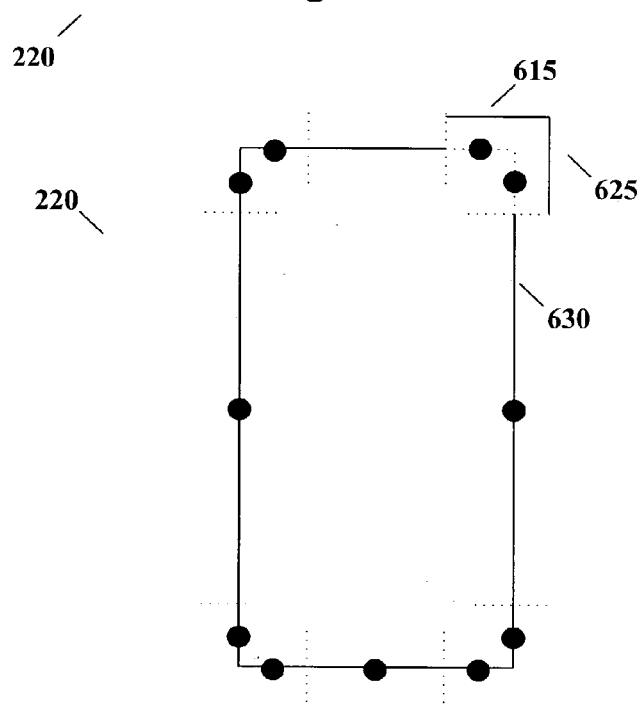
FIG. 6C illustrates the rectangular geometric feature of FIG. 6A after two segments in the upper-right corner have been adjusted using model-based optical proximity correction.
Figure 6D:
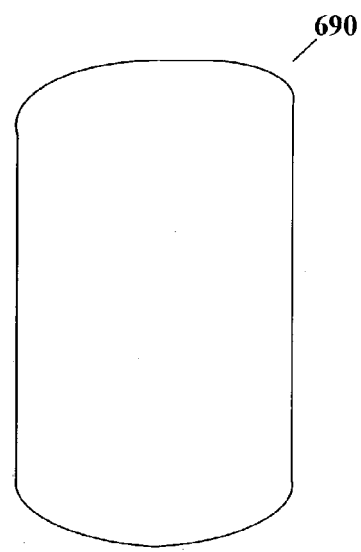
FIG. 6D illustrates a circuit element created in the photoresist of a silicon wafer using the optical proximity adjusted photomask of FIG. 6C.

To correct the shortening and rounding of the upper-right corner, segment 610 and segment 620 may be moved out to provide more area. An example of this is illustrated in FIG. 6C wherein segment 610 has been moved up to create segment 615 and segment 620 has been moved right to create segment 625. Note that the endpoints of the moved segments will remain coupled to the unmoved segments using additional segments to connect the endpoints. Thus, a newly created horizontal segment will couple segment 625 and unmoved segment 630 in FIG. 6C. FIG. 6D illustrates the improved output wherein the upper right-hand corner 690 is less rounded. Through simulation, it may be found that by moving segments 610 and 620 out by a certain amount, light intensity at the evaluation points gets gradually closer and eventually meets a target threshold. Since the evaluation point is chosen such that it will represent the behavior when printed, we can conclude that the printing will meet the specified target with the specified edge movement. Note that this process completes a verification process for this particular segment.

Model-based optical proximity correction is a very powerful tool for ensuring that a fabricated circuit operates as desired since it can be used to verify that all the created circuit features meet the minimum requirements. However, this power comes at a cost. To use model-based optical proximity correction across an entire complex design requires many hours of computation time. For many projects, having a fast turn-around time is very important. It would therefore be desirable to have methods that produces the accuracy of model-based optical proximity correction without requiring such a large amount of time for computations.

Mixed Mode Optical Proximity Correction

To perform optical proximity correction in a time-efficient manner that produces functional results, the present invention introduces a mixed-mode system of optical proximity correction. Specifically, the present invention introduces several methods of combining the two different methods of performing optical proximity correction such that very good results can be achieved in short amount of time.

Rule Based OPC then Model Based OPC

In a first embodiment, a rule-based optical proximity correction system parses through a semiconductor layout to perform a first pass optical proximity correction and then a model-based optical proximity correction system is used to cure any remaining trouble spots. A sample implementation is illustrated in FIG. 7.

Referring to FIG. 7, a first step 720 applies a set of optical proximity correction rules to the semiconductor layout. The rules used in step 720 modify the layout in attempts to correct certain problems that can be located by identifying specific conditions in the layout. However, there are layout problems that are not easily identified with a rule.

Next, at step 730, the system applies a lithography model to the semiconductor to determine how the manufactured output of the current layout would appear. At step 740, the system tests the modeled output to determine if the manufactured output from the layout conforms to a designated specification. If no problem is detected, the system proceeds to step 770 to output a final semiconductor layout.

If a layout problem is detected, the system proceeds to step 750 to correct the problem using the model-based optical proximity correction system. In one embodiment, a model-based OPC system determines the outcome of two different feature placements and then interpolates an ideal position between the two placements. A number of different identified problems may be addressed during step 750. The system then proceeds to again check the layout with manufacturing model at step 730. This process iterates until no more significant problems are detected at step 740. Once no significant problems are detected at step 740 the system outputs a final semiconductor layout at step 770.

The method illustrated in FIG. 7 provides advantages over rule-based OPC or model-based OPC alone. The system provides a better output layout than rule-based OPC alone since the model-based OPC portion handles many situations that are not handled easily using rule-based OPC. Furthermore, the system may be faster than model-based OPC alone since many layout problems are quickly solved using rule-based OPC such that model-based OPC may not be needed in many situations. Furthermore, it should be noted that the entire design is validated using model-based OPC such that the system creates layouts that are just as good as model-based OPC corrected only layouts but in less time since the rule-based OPC corrects many problems that are easily identified using rule-based OPC.

Rule-Based OPC and Selective Model-Based OPC

In other embodiments of the present invention, a rule-based proximity correction system and a proximity correction system are selectively used depending on the situation. Various different embodiments of this technique have been implemented.

Figure 8:
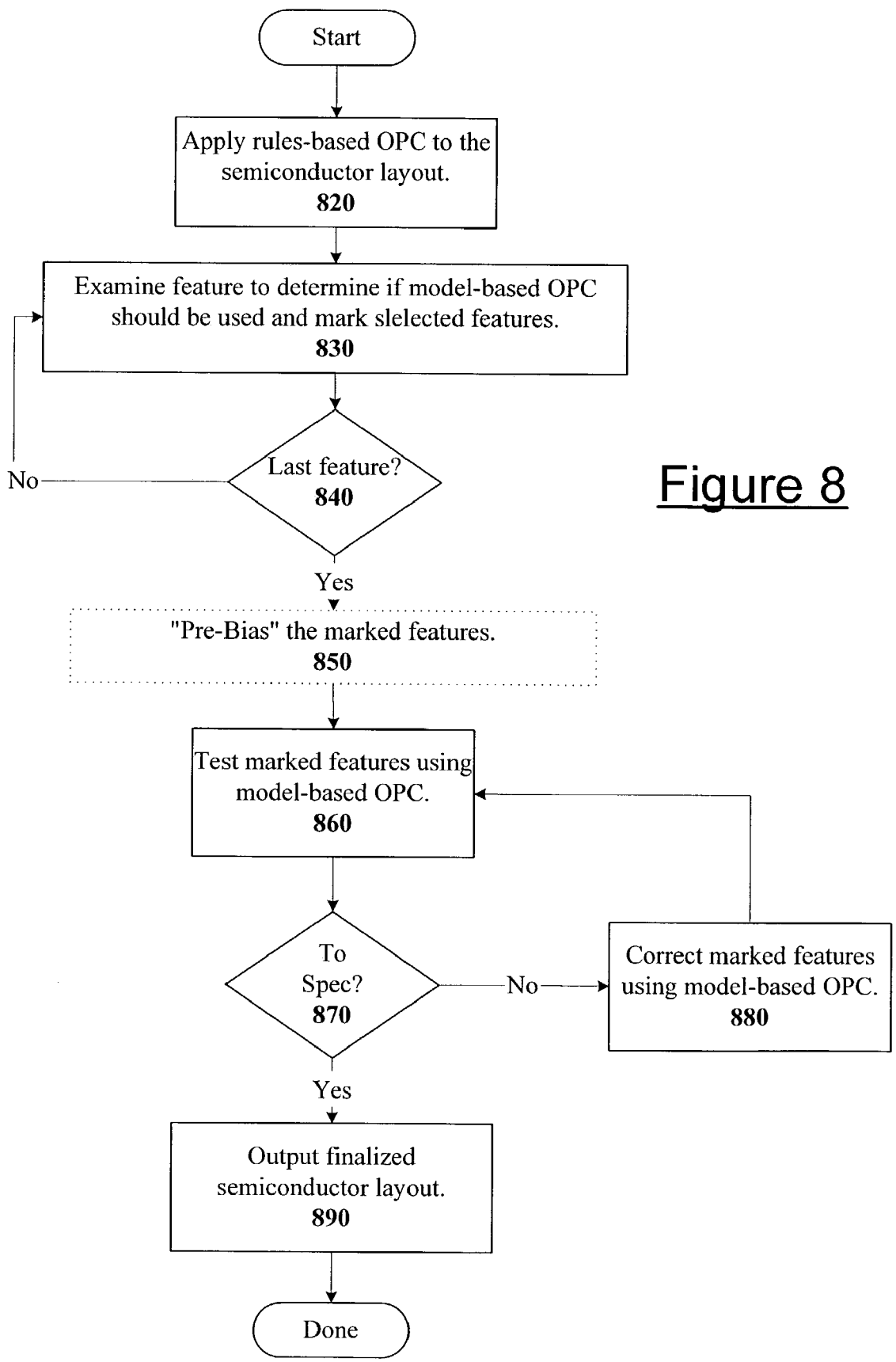
FIG. 8 illustrates a flow diagram of an optical proximity correction system that applies rule-based optical proximity correction and then selectively applies model-based optical proximity correction.

FIG. 8 illustrates a first embodiment of a selective optical proximity correction system wherein the rules-based OPC is used for all features, but the model-based OPC is selectively used. Referring to step 820 the system applies a set of optical proximity correction rules to the semiconductor layout. The rules correct a number of problems that can easily be identified using a set of rules. The rules may be created using multiple different models. For example, clear field patterns could be fitted better using one model and dark field patterns may be fitted better using another model.

At step 830, the system enters a loop that begins to examine every feature in the layout to determine if model-based optical proximity correction should be applied to that feature. The system may look for certain features where layout problems that cannot be easily corrected using a rule. The features that need model based OPC are marked at step 830.

At step 830, the system breaks down all the features identified for model-based OPC. The feature break down may occur as illustrated in FIG. 6A where a geometric feature has been divided into sub segments. By determining if a particular segment falls within a certain situation, the present invention will determine if the segment should be processed by a model-based optical proximity correction system. A set of defined rules can be used to make such determinations. For example, the following three rules may specify situations wherein model-based optical proximity correction may be advisable:

1. If a segment forms portion of an outside corner then process the segment with a model-based optical proximity correction system.
2. If a segment forms an edge of a narrow feature then process the segment with a model-based optical proximity correction system.
3. If a segment forms an edge that is closely parallel to a neighboring feature then process the segment with a model-based optical proximity correction system.

These are only examples of decision rules that may be used to determine if model-based optical proximity correction should be used.

Referring back to FIG. 8, at step 850 the system determines the outcome of the rule tests. If the segment fell within one of the conditions defined in a rule, then the system examines and corrects the segment using model-based optical proximity correction at step 840. The system then proceeds to the next segment at step 830.

After examining a feature to determine if it falls within one of conditions wherein model-based optical proximity correction is required, the system proceeds from step 830 to step 840 where it determines if this was the last feature to examine. If the examined feature was not the last feature then the system proceeds back to step 830 to examine the next feature. Once all the features have been tested, the system may optionally pre-bias the marked features at step 850. However, it is not likely that the pre-bias is needed in this case since all the edges have been pre-corrected using rules-based OPC.

After pre-biasing (if done), the system applies a lithography model to the layout at step 860 to determine how the manufactured output of the current layout would appear. At step 870, the system tests the modeled output to determine if the manufactured output from the layout conforms to a designated specification. If no problem is detected, the system proceeds to step 890 to output a final semiconductor layout.

If one or more layout problems are detected, the system proceeds to step 880 to correct the problems using the model-based optical proximity correction system. The system then proceeds to again check the layout with manufacturing model at step 860. This process iterates until no more significant problems are detected at step 870. Once no significant problems are detected at step 870 the system outputs a final semiconductor layout at step 890.

The system of FIG. 8 allows rule-based optical proximity correction to correct many easily identified problems but then uses model-based optical proximity correction to carefully handle features in difficult situations. Thus, the system of FIG. 8 produces a high quality semiconductor layout without requiring the computation time of a full model-based optical proximity correction pass. The system of FIG. 8 will be significantly faster than a normal model-based OPC system since model-based OPC is not applied to every feature.

Selective Rule-Based OPC or Model-Based OPC

FIG. 9 illustrates another embodiment of a selective optical proximity correction system. In the system of FIG. 9, features are selectively processed using rule-based OPC or model-based OPC but not both.

The embodiment of FIG. 9 begins as a loop that examines each feature. First, at step 910 each feature is tested with a set of selective rules that determine if rule-based optical proximity correction or model-based optical proximity correction should be used on that feature. The same set of rules as defined in the previous section may be used. Note that the selective rules are designed to safeguard the rule correction areas to ensure that the rule correction actually will meet the specification. Thus, such features can skip the performance check or model-based OPC. The determination at step 920 marks each feature to be model-based OPC correct at step 925 or to be rule-based OPC correct at step 930. This process is repeated for all features using the decision step at step 940.

At step 950 the system invokes rule-based optical proximity correction to correct all the features marked for rule based OPC at step 930. Those features marked for model-based OPC are not examined.

At step 960, the system may optionally pre-bias the features marked for model-based optical proximity correction. The pre-bias may be a set of rules in which the pattern is defined solely by the feature shape itself and the surrounding environment is ignored.

A step 970, the system tests the features marked for model-based OPC with a model of the manufacturing process. If all features are to specification at step 980, then the system outputs a final semiconductor layout at step 990. Otherwise, the features marked for model-based OPC are corrected using model-based OPC at step 985.

Selective Rule-Based OPC, Model-Based OPC, Rule and Model OPC or No Correction

FIG. 10 illustrates a conceptual diagram of yet another possible embodiment of a selective OPC system. In the system of FIG. 10, each of the features may be adjusted using rule-based OPC, model-based OPC, rule and model based OPC, or no correction at all.

Referring to the conceptual diagram of FIG. 10, the first step is to process the layout to put it in a form where it may be tested using a set of correction type selection rules. As indicated in step 1010, this may be performed by dividing the layout into individual segments and setting evaluation points. However, other systems may be used.

Next, at step 1020, all of the segments are examined and divided into different sets wherein each set will have a different OPC correction system used. Some segments will be placed into a set where no correction (NC) is needed. A second set of segments will then be placed into a set wherein only rule-based correction (RC) will be applied. A third set of segments will then be placed into a set wherein only model-based correction (MC) will be applied. Finally, a fourth set of segments will be placed into a set that will use both rule and model based correction (RMC).

The system will then process each set of segments accordingly. The segments that require no correction will be placed directly into the output. The segments that require rule-based correction (RC) or rule and model based correction (RMC) segments will be processed using rule-based correction at step 1030. The rule-based correction only (RC) segments will then be placed into the output as set forth in step 1040.

The model-based correction only (MC) segments may be pre-biased at step 1050. Finally, the model-based correction only (MC) segments and the rule and model based correction (RMC) segments are processed using model-based OPC at step 1060.

Figure 11A:
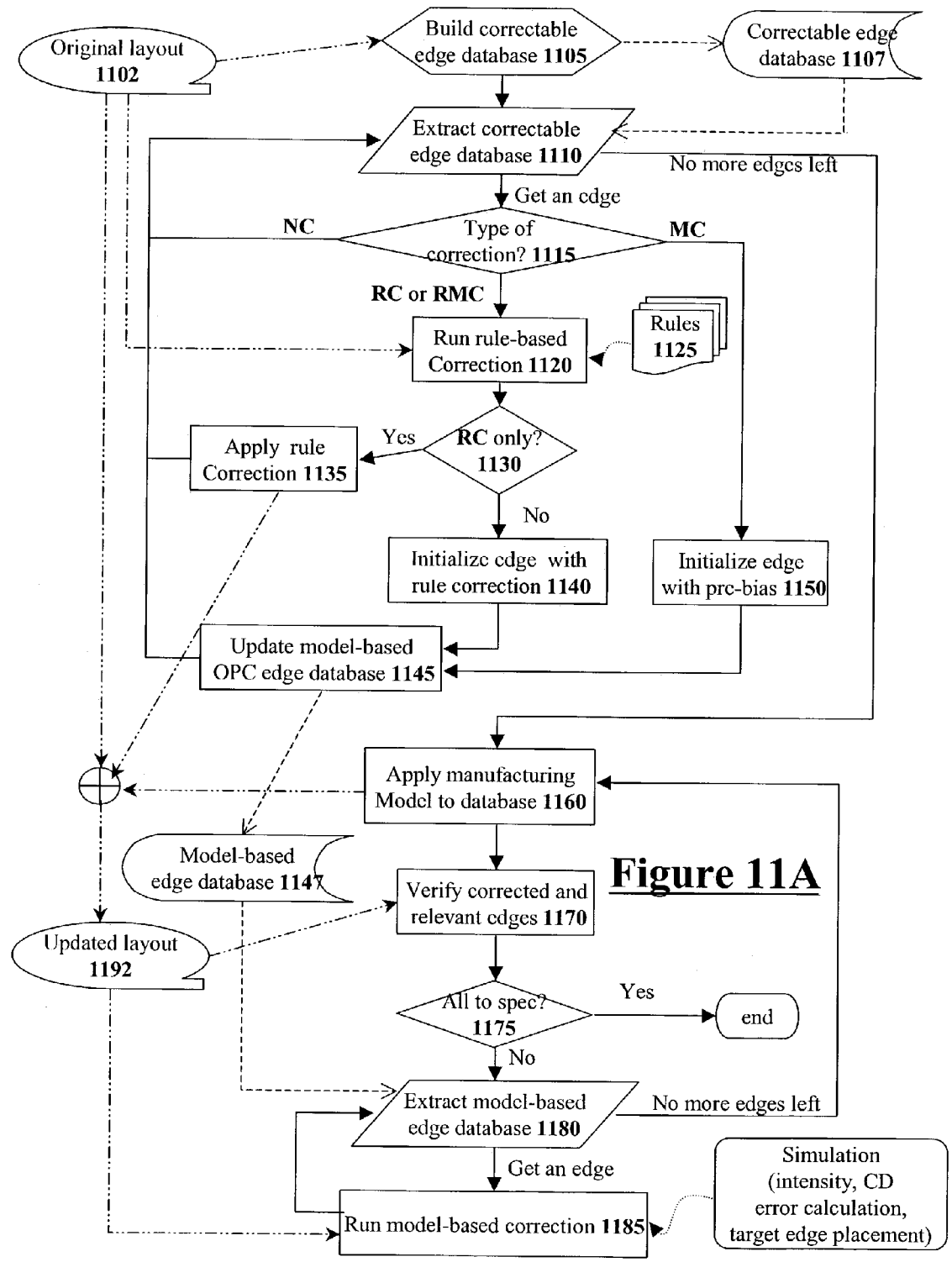
FIG. 11A illustrates a detailed flow diagram for one embodiment of the optical proximity correction system that selectively applies rule-based optical proximity correction, model-based optical proximity correction, rule-based and model-based optical proximity correction, or no correction to various layout features as set forth in FIG. 10.

FIG. 11A illustrates a detailed flow diagram describing one implementation of the selective OPC system of FIG. 10. The embodiment of FIG. 11A has been described with reference to an edge based system. However, the same teachings can be applied to other types of systems such as a shape based correction system. FIG. 11A has been illustrated with three different line types. A legend for the different dataflow types is provided in FIG. 11B.

Referring to FIG. 11A, the system begins with an original layout 1102. From the original layout 1102, the system builds a correctable edge database 1107 at step 1105. Note that a correctable edge database does not have to be explicitly be created and maintained in all embodiments. For example, one embodiment may explicitly derive the edges from the layout database 1102 on the fly. The system then proceeds to examine all the edges in the correctable edge database 1107 to determine which type of correction should be used on each edge. At step 1110, the system extracts an edge from the correctable edge database 1107 and tests that edge at step 1115. If no correction is required the system proceeds back to step 1110 to examine another edge.

If the edge needs rule-based OPC (RC) or rule and model based OPC (RMC) then the system proceeds to step 1120 to apply the rules 1125. Note that rule-based correction can be performed on an edge by edge basis. If the edge required only rule-based OPC (RC) then the system applies the correction to the layout database as specified in step 1135 before returning to step 1110 to examine another edge. If the edge requires rule and model based OPC (RMC) then the system proceeds to step 1140 to initialize the edge with the correction from the rule. That corrected edge is then used to update a model-based OPC edge database 1147 at step 1145. After updating the model-based OPC edge database 1147, the system proceeds back to step 1110 to examine another edge.

Referring back to step 1110, if the edge requires model-based OPC only (MC), then the system proceeds to step 1150 where the system may pre-bias the edge. Then, the system updates the model-based OPC edge database 1147 at step 1145 with that pre-biased edge. After updating the model-based OPC edge database 1147, the system proceeds back to step 1110 to examine another edge. After all the edges have been examined at step 1110, the system proceeds to begin the model-based correction stage.

At step 1160, the system applies the manufacturing model to the edge database. At step 1170, the system tests all the evaluation points for the various edges to correct with model-based correction. If, at step 1175, all the edges meet a defined specification then the system is done. Otherwise, the system proceeds to step 1180 to iteratively extract each edge from the model-based edge database 1147 and apply a model based correction at step 1185. This is performed until all the edges needing model based OPC have been adjusted. The system then again applies the manufacturing model and tests the evaluation points at steps 1160, 1170 and 1175 to determine if the all edges are now to specification. This iterative process continues until the layout conforms to the defined specification.

Using Multiple Different Models

As set forth in the introductory section on model-based OPC, many different types of models have been created to model various semiconductor-manufacturing processes. Each model may have its own particular strengths and weaknesses. Some models may be better than other models in certain defined circumstances.

The hybrid OPC system of the present invention may take advantage of these different models. As set forth in the previous sections, many embodiments use various rules to specify a particular correction system to be used. These rule sets may be expanded to select a particular type of OPC model that should be used to evaluate a particular feature. Thus, if a particular manufacturing model is better than other manufacturing models at modeling a particular feature, then that manufacturing model may be used to test and correct that particular feature. For example, a rule set may specify that inner corner segments should be modeled with model 1, the outer corner segments should be modeled with model 2, and the edge segments should be modeled with model 3. In this manner, the system will take advantage of the best model for each particular circumstance.

Applications of Hybrid OPC

The hybrid OPC system of the present invention is very useful for traditional optical lithography semiconductor manufacturing. However, its application is not limited to that area. The teachings of the present invention may be used for any photo-mask based manufacturing process. For example, the teachings of the present invention may be applied to both binary masks and phase-shifting masks. Information about phase-shifting masks can be found in U.S. Pat. No. 5,858,580 issued on Jan. 12, 1999 entitled "Phase shifting circuit manufacture method and apparatus" which is hereby incorporated by reference.

In one embodiment, the rules may be adjusted to support specialized layouts. For example, a set of rules may specify that rule-based OPC should be used to process the binary portion of a layout and that model-based OPC should be used to process the phase-shifted portion of a layout. In this manner, the best processing is provided to those critical sections that need it the most.

Pre-Filtering

To limit the hybrid OPC system of the present invention, the software may be configured to "pre-filter" its operation. For example, a user may designate only specific areas for hybrid OPC processing. In one embodiment, the user may specify only certain cells of a layout for OPC processing. Furthermore, the type of processing to perform may be limited on a cell by cell basis. For example, certain cells may be processed with rule only OPC, other cells may be processed with model based OPC, and other cells may be processed with the hybrid OPC system. Certain features may overlap areas. For an area-based correction, the present invention may define another layer in the layout and decide that all the segments overlapped by this layer should be, corrected by a specific OPC system.

Verification Using Model Based Correction

As set forth in the previous sections, many embodiments of the present invention use model based OPC to test and set all the features in a layout design. The testing is performed using a verification specification. In such embodiments wherein all the features are tested with a verification specification, the layout is inherently fully verified by the OPC processing. Thus, no separate verification step is necessary.

To enhance the verification capabilities, the model based OPC portion of such embodiments may be improved to offer additional features sometimes available in traditional verification tools. For example, the model-based OPC portion may provide an option to test a layout design at various dose settings. This may be accomplished by adjusting the model threshold (dose). Similarly, the model-based OPC portion may provide an option to test a layout design at various focus settings. This may be accomplished by building new models at certain defocus values in order to provide focus latitude verification.

Learning Based on Model Based Correction

When performing model-based OPC, the system will perform an iterative trial and error process to adjust features (such as edge placements) in order to correct defects in a layout. However, if changes are made to a layout design, then the entire OPC process must be performed again. Since the OPC process is a very long computationally expensive task, a simple design change may cause a long delay due to the OPC process.

To prevent such delays, the present invention introduces the idea of creating a database of changes made to a particular layout such that if a slightly changed version of the same layout is again processed, the unchanged areas can be quickly corrected using the stored database of changes. The process would simply verify that an area that was corrected in a previous OPC process has not changed such that the same correction can be applied.

In one embodiment, this correction database takes the form of a rule database. Specifically, each model-based OPC correction is stored along with the initial condition that caused the model-based OPC correction. In this manner, the set of rules can be applied to quickly bring a slightly modified design into a form where it is nearly fully corrected. The system then just applies model-based OPC to the changed areas.

An Example Embodiment

Figure 12:
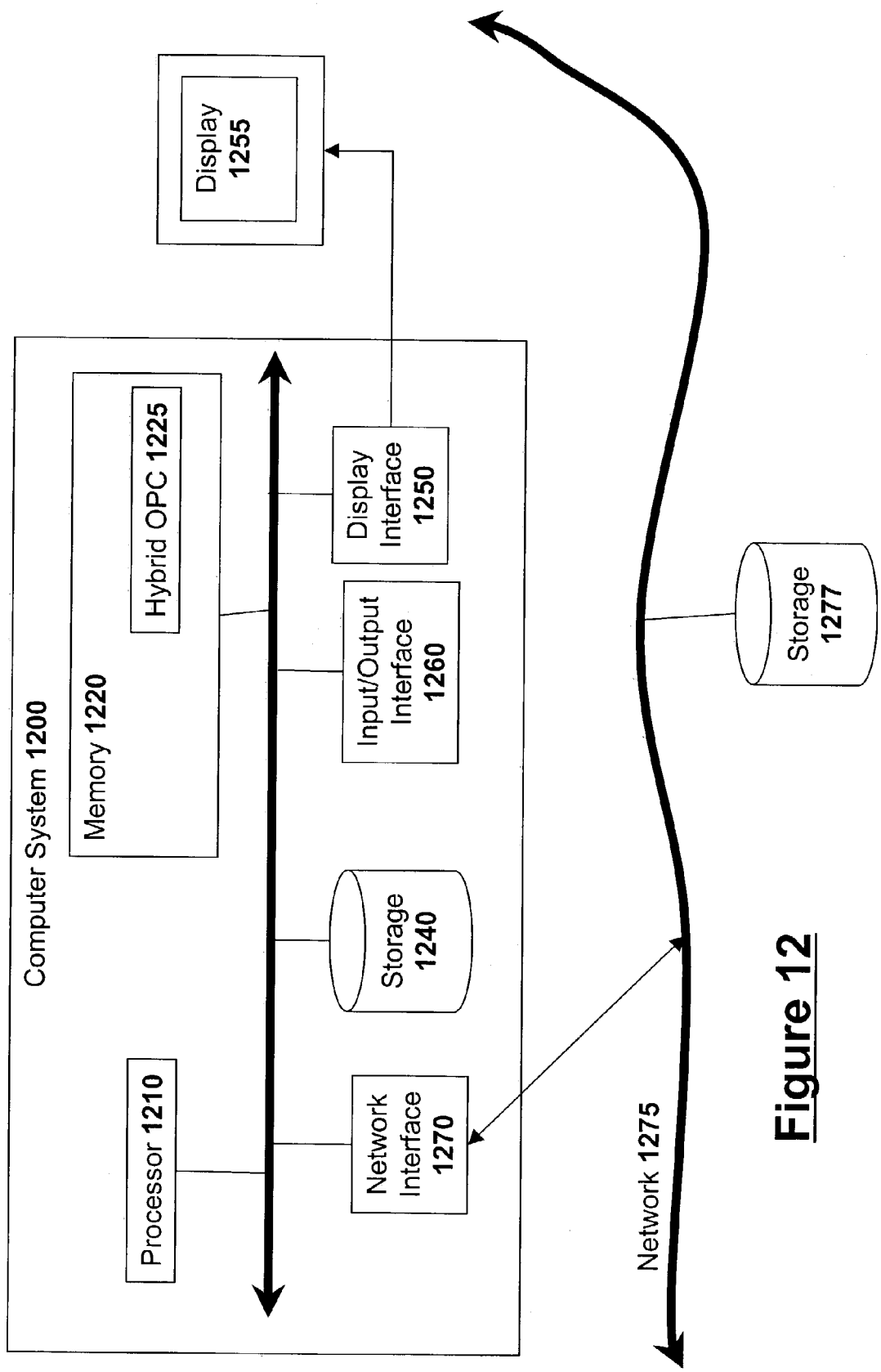
FIG. 12 illustrates a computer system that may embody the teachings of the present invention.

The hybrid OPC system of the present invention may be used in many different environments. FIG. 12 illustrates one example of how the hybrid OPC system may be implemented. Referring to FIG. 12, a computer system 1200 contains a processor 1210 for executing computer instructions and a memory 1220 for storing computer programs. The hybrid OPC system of the present invention may be implemented as a hybrid OPC program 1225 that runs within the memory 1220. The hybrid OPC program 1225 may process layout data stored within local storage device 1240.

The hybrid OPC program 1225 may also work within a network environment. Referring to FIG. 12, the computer system 1200 may also have a network interface 1270 that couples the computer system 1200 to a network 1275. In such an embodiment, the hybrid OPC program 1225 may process data located on network accessible storage systems such as storage device 1277.

The hybrid OPC program 1225 may be leased or sold to customers that wish to improve their semiconductor layouts. The hybrid OPC program 1225 may be distributed on magnetic, optical, or other computer readable media. Alternatively, the hybrid OPC program 1225 may be distributed electronically using any transmission medium such as the Internet, a data broadcast, or any other digital transmission medium.

The foregoing has described a method and apparatus for mixed-mode optical proximity correction of semiconductor circuit layouts. It is contemplated that changes and modifications may be made by one of ordinary skill in the art, to the materials and arrangements of elements of the present invention without departing from the scope of the invention.

We claim:

1. A method of preparing a semiconductor mask, said method comprising:
   accepting a semiconductor design;
   processing said semiconductor design with a set of optical proximity correction rules to produce a rule corrected semiconductor design;
   selectively pre-biasing features of said rule corrected semiconductor design designated for model based correction to produce a bias corrected semiconductor design;
   modeling said rule corrected semiconductor design or said bias corrected semiconductor design with an optical model to produce a modeled semiconductor design; and
   outputting said modeled semiconductor design for preparing said semiconductor mask.

2. The method as claimed in claim 1 wherein said step of selectively pre-biasing comprises applying a set of rules to the features based solely on feature shape.

3. A method of preparing a semiconductor mask, said method comprising:
   accepting a semiconductor design;
   processing said semiconductor design with a set of optical proximity correction rules to produce a rule corrected semiconductor design;
   modeling said rule corrected semiconductor design or a bias corrected semiconductor design with an optical model to produce a modeled semiconductor design;
   verifying said modeled semiconductor design against specifications using a user-selected dose setting to produce a verified semiconductor design; and
   outputting said verified semiconductor design for preparing said semiconductor mask.

4. A method of preparing a semiconductor mask, said method comprising:
   accepting a semiconductor design;
   processing said semiconductor design with a set of optical proximity correction rules to produce a rule corrected semiconductor design;
   modeling said rule corrected semiconductor design or a bias corrected semiconductor design with an optical model to produce a modeled semiconductor design;
   verifying said semiconductor design against specifications using a user-selected focus setting to produce a verified semiconductor design; and
   outputting said verified semiconductor design for preparing said semiconductor mask.

5. A method of preparing a semiconductor mask, said method comprising:
   accepting a semiconductor design;
   processing said semiconductor design with a set of optical proximity correction rules to produce a rule corrected semiconductor design;
   examining said rule-corrected semiconductor design to identify a set of features to process with model-based optical proximity correction;
   selectively pre-biasing said set of features before model-based optical proximity correction;
   processing said set of features with model-based optical proximity correction; and
   outputting a final corrected semiconductor design.

6. The method as claimed in claim 5 wherein processing said set of features with model-based optical proximity correction comprises verifying said semiconductor design against specifications.

7. The method as claimed in claim 6 wherein a user may select a dose setting for said verifying.

8. The method as claimed in claim 6 wherein a user may select a focus setting for said verifying.

9. The method as claimed in claim 5 wherein examining said rule-corrected semiconductor design to identify a set of features to process with model-based optical proximity correction comprises applying a set of rules to identify difficult features.

10. The method as claimed in claim 5 wherein examining said rule-corrected semiconductor design further comprises selecting a particular model-based optical proximity correction system for each feature.

11. The method as claimed in claim 5 wherein a feature comprises a segment.

12. The method as claimed in claim 5 wherein a feature comprises a shape.

13. A semiconductor device, said semiconductor device created from a processed layout generated by:
   processing an input layout design with a set of optical proximity correction rules to produce a rule corrected semiconductor design;
   selectively pre-biasing features of said rule corrected semiconductor design designated for model based correction to produce a bias corrected semiconductor design;
   modeling said rule corrected semiconductor layout design or said bias corrected semiconductor design with an optical model to produce a modeled semiconductor mask; and
   outputting said modeled semiconductor design for preparing said semiconductor device.

14. A semiconductor device, said semiconductor device created from a processed layout generated by:
   processing an initial semiconductor layout with a set of optical proximity correction rules to produce a rule corrected semiconductor layout;
   examining said rule-corrected semiconductor layout to identify a set of features to process with model-based optical proximity correction;
   processing said set of features with model-based optical proximity correction to produce a modeled semiconductor layout;
   verifying said modeled semiconductor layout against specifications using at least one of a user-selected dose and focus;
   outputting a final corrected semiconductor layout design.

15. A computer readable medium, said computer readable medium containing computer instructions for:
   processing an input layout design with a set of optical proximity correction rules to produce a rule corrected semiconductor design;
   modeling said rule corrected semiconductor layout design with an optical model to produce a modeled semiconductor design; and
   verifying said modeled semiconductor design against specifications using at least one of a user-selected dose and focus.

16. A computer readable medium, said computer readable medium containing computer instructions for:
   processing an initial semiconductor layout with a set of optical proximity correction rules to produce a rule corrected semiconductor layout;
   examining said rule-corrected semiconductor layout to identify a set of features to process with model-based optical proximity correction;
   selectively pre-biasing said set of features before processing said set of feature with model-based optical proximity correction;

processing said set of features with model-based optical proximity correction; and outputting a final corrected semiconductor layout design.

17. A computer data signal embodied in an electromagnetic waveform comprising computer instructions for:

processing an input layout design with a set of optical proximity correction rules to produce a rule corrected semiconductor design;

modeling said rule corrected semiconductor layout design with an optical model to produce a modeled semiconductor design;

verifying said modeled semiconductor design against specifications using at least one of a user-selected dose and focus to produce a verified semiconductor design; and outputting said verified semiconductor design.

18. A computer data signal embodied in an electromagnetic waveform comprising computer instructions for:

processing an initial semiconductor layout with a set of optical proximity correction rules to produce a rule corrected semiconductor layout;

examining said rule-corrected semiconductor layout to identify a set of features to process with model-based optical proximity correction;

selectively pre-biasing said set of features before processing said set of feature with model-based optical proximity correction;

processing said set of features with model-based optical proximity correction; and outputting a final corrected semiconductor layout design.

19. A computer apparatus, said computer apparatus comprising:

a processor for processing computer instructions; and a memory, said memory containing a set of computer instructions for processing an input layout design with a set of optical proximity correction rules to produce a rule corrected semiconductor design, modeling said rule corrected semiconductor layout design with an optical model to produce a modeled semiconductor design, and verifying said modeled semiconductor design against specifications using at least one of a user-selected dose and focus.

20. A computer apparatus, said computer apparatus comprising:

a processor for processing computer instructions; and a memory, said memory containing a set of computer instructions for processing an initial semiconductor layout with a set of optical proximity correction rules to produce a rule corrected semiconductor layout, examining said rule-corrected semiconductor layout to identify a set of features to process with model-based optical proximity correction, and selectively pre-biasing said set of features before processing said set of feature with model-based optical proximity correction, processing said set of features with model-based optical proximity correction, and outputting a final corrected semiconductor layout design.

* * * * *